United States Patent [19]
Suzuki et al.

[11] Patent Number: 5,621,758
[45] Date of Patent: Apr. 15, 1997

[54] PWM COMMUNICATION SYSTEM

[75] Inventors: Shinichi Suzuki; Hirofumi Yamazoe, both of Hyogo, Japan

[73] Assignees: Mitsubishi Electric Semiconductor Software, Hyogo; Mitsubishi Denki Kabushiki Kaisha, Tokyo, both of Japan

[21] Appl. No.: 591,718

[22] Filed: Jan. 25, 1996

[30] Foreign Application Priority Data

Aug. 9, 1995 [JP] Japan .................................... 7-203184

[51] Int. Cl.⁶ .................................................. H03K 9/08
[52] U.S. Cl. .............................. 375/238; 327/31; 329/312
[58] Field of Search .................................... 375/238, 224; 327/31, 37; 329/312; 370/9, 8; 341/64, 94; 371/5.1

[56] References Cited

U.S. PATENT DOCUMENTS

| | | | |
|---|---|---|---|
| 4,608,630 | 8/1986 | Schott | 375/238 |
| 5,122,778 | 6/1992 | Erhart | 340/146.2 |
| 5,315,299 | 5/1994 | Matsumoto | 375/238 |
| 5,436,853 | 7/1995 | Shimohara | 375/238 |
| 5,459,751 | 10/1995 | Okamoto | 375/238 |
| 5,483,542 | 1/1996 | Nguyen | 371/5.1 |

FOREIGN PATENT DOCUMENTS 3154428 10/1989 Japan .
5292042 4/1992 Japan .

Primary Examiner—Stephen Chin
Assistant Examiner—Betsy P. Lee
Attorney, Agent, or Firm—Leydig, Voit & Mayer

[57] ABSTRACT

A data output portion transmits a pulse signal having a pulse width according to a value of transmit data on a predetermined cycle. An H pulse width counter and an L pulse width counter measure a length of a high level period and a length of a low level period in the received pulse signal by using a clock signal having the same frequency as that of the clock signal used in the data output portion. A comparing portion compares the sum of both the measured lengths of the periods with the predetermined cycle, and outputs an error signal in case of a mismatch. In a PWM communication system, it is also possible to detect a signal delay or an error of the clock signal, which is temporarily caused within one cycle.

8 Claims, 14 Drawing Sheets

PWM COMMUNICATION SYSTEM

BACKGROUND OF THE INVENTION

1. Field of the Invention

The present invention relates to a PWM communication system used for transmission and reception of data, in which, in a pulse string including pulses having constant cycle, a length of a high level period or a low level period of the pulse is set to correspond to the data.

2. Description of the Prior Art

FIG. 14 is a block diagram showing a structure of a conventional PWM communication system disclosed in, for example, Japanese Patent Publication (Kokai) No. 3-154428. In the drawing, reference numeral 101 is a CPU set on a transmitting system (hereinafter referred to as a transmitting CPU) to transmit a PWM signal to a transmission line 3, 102 is a CPU set on a receiving system (hereinafter referred to as a receiving CPU) to take the PWM signal as input from the transmission line 3, 104 is a power source to feed power required for the transmitting CPU 101 and the receiving CPU 102, 14 is a clock generating portion to feed the transmitting CPU 101 with a clock signal to set a pulse cycle and a data length, and 28 is another clock generating portion to feed the receiving CPU 102 with a clock signal. FIG. 15 is a timing diagram showing one illustrative PWM signal. In FIGS. 15 and 16, reference mark T means a pulse cycle, and $t_1$, $t_2$, and $t_n$ are data lengths. In this case, low level periods in the pulses correspond to data.

A description will now be given of the operation. The transmission line 3 is connected to an output port of the transmitting CPU 101 and an input port of the receiving CPU 102. The transmitting CPU 101 sets the level on the output port connected to the transmission line 3 to low. Subsequently, the level on output port is set to high after a lapse of a time corresponding to the data length $t_1$. Further, after a lapse of time corresponding to the pulse cycle T after the level on the output port is set to low, the transmitting CPU 101 sets the level on the output port to low once again.

Next, the transmitting CPU 101 sets the level on the output port to high after a lapse of time corresponding to the data length $t_2$. Further, after the lapse of time corresponding to the pulse cycle T after the level on the output port is set to low, the transmitting CPU 101 sets the level on the output port to low again. Similarly, the transmitting CPU 101 sets the level on the output port to high after a lapse of time corresponding to the data length $t_n$. Further, after the lapse of time corresponding to the pulse cycle T after the level on the output port is set to low, the transmitting CPU 101 sets the level on the output port to low. In such a manner, the PWM signals having the data lengths $t_1$, $t_2$, and $t_n$ respectively as shown in FIG. 15 is sequentially transmitted to the transmission line 3.

The receiving CPU 102 takes as input the signal on the transmission line 3 through the input port so as to measure a time interval from a fall time to a rise time of the signal developed at the input port. At the rise time of the signal developed at the input port, in the receiving CPU 102, it is decided that the PWM signal having a data length corresponding to the measured time is received. In such a way, the receiving CPU 102 can receive the data corresponding to the data length in the PWM signal.

In data communication using the PWM signal, an error may be caused in a measured value in the receiving CPU 102 due to a signal delay between the transmitting CPU 101 and the receiving CPU 102, or error between clock signals fed from both the clock generating portions 14 and 28. When the error is caused in the measured value, the receiving CPU 102 may possibly recognize that the receiving CPU 102 receives data different from original data. In order to avoid the possibility, the receiving CPU 102 corrects the measured data lengths $t_1$, $t_2$, and $t_n$.

Referring now to FIG. 16, a description will now be given of a method of correction. The receiving CPU 102 corrects the measured data length $t_n$ according the following expression by using a ratio $T/T_c$ of a measured value $T_c$ between a fall time developed at the input port and the fall time subsequently developed at the input port, to the original pulse cycle T:

$$t_n' = t_n \cdot (T/T_c)$$

This can reduce the error of the measured value due to the signal delay or the error of the clock signal. In addition, Japanese Patent Publication (Kokai) No. 3-154428 discloses a method of correction according to the above expression, using a mean value of a plurality of measured values $T_c$.

Japanese Patent Publication (Kokai) No. 5-292042 discloses another method of reducing the error of the measured value. That is, before transmission of data, a reference pulse is sent from the transmitting system to the receiving system. The receiving CPU measures a width of the reference pulse, and corrects a pulse width of a subsequently received PWM signal by using the measured value and the original width of the reference pulse.

The conventional PWM communication system has the above structure. Thus, it is possible to overcome problems of the steadily generating signal delay and the steadily generating error of the clock signal, and overcome a further problem in that one cycle is expanded or contracted as a whole. However, there is a drawback in that it is impossible to overcome a signal delay or an error of the clock signal, which is temporarily caused within one cycle.

For example, though the transmitting system and the receiving system can recognize an interval between a point A and a point B in FIG. 16 as an identical interval, a point C recognized by the receiving system may temporarily be deviated from the original point C due to some cause. In this case, in the conventional system, data recognized by the receiving system becomes erroneous data in spite of execution of the above correction. As a result, the receiving system can not recognize that the erroneous data is received.

SUMMARY OF THE INVENTION

In order to overcome the above problems, it is an object of the present invention to provide a PWM communication system in which an error of data can surely be detected in a receiving system.

According to the present invention, there is provided a PWM communication system including signal transmitting circuit for creating a pulse signal having a pulse width according to a value of transmit data by counting pulses in a clock signal, and transmitting the created pulse signals to a transmission line on a predetermined cycle, pulse width measuring circuit for measuring a length of a high level period and a length of a low level period in the pulse signal inputted from the transmission line by using a clock signal having a frequency equivalent to a frequency of the clock signal used in the signal transmitting circuit, and comparing circuit for comparing the sum of the length of the high level period and the length of the low level period with the predetermined cycle, and outputting an error signal in case of a mismatch. According to the above structure, it is possible to surely detect the error of data in the receiving system.

The signal transmitting circuit may divide the transmit data into a plurality of data, and may transmit each data to the transmission line on a cycle set according to the maximum value of each divided data. For example, when one data includes four bits after the division, the maximum value of data is 15 (in decimal notation). In this case, the data can be transmitted in a short time, that is, at a high speed.

The signal transmitting circuit may use a length corresponding to $(2^n-1)$ pulses (n being a positive integer) in the clock signal as the predetermined cycle. In this case, in the pulse signal represented in binary notation, any one of the length of the high level period and the length of the low level period is the one's complement of the other. As a result, it is possible to surely detect the error of data by a simple comparing method.

The comparing circuit may take as input the length of the high level period and the length of the low level period represented in binary notation from the pulse width measuring circuit, and may compare any one of the lengths with the one's complement of the other so as to output an error signal in case of a mismatch. As a result, it is possible to surely detect the error of data in simple hardware.

In the PWM communication system, the signal transmitting circuit may add dummy bits to the low-order bit position of the least significant bit of the original transmit data represented in binary notation, and may create a pulse signal by regarding data including the additional dummy bits as the transmit data. In this case, the PWM communication system includes data restoring circuit for converting a significant period of the pulse signal inputted from the transmission line into a binary number, and restoring the original transmit data by removing bits corresponding to the dummy bits from the binary number. "Significant period" as used herein means a high level period in the inputted pulse signal when the signal transmitting circuit sets a value of the transmit data to correspond to the high level period in the pulse signal. Consequently, "significant period" means a low level period in the inputted pulse signal when the signal transmitting circuit sets the value of the transmit data to correspond to the low level period in the pulse signal. In this case, even when all-zero binary transmit data or all-one binary transmit data is transmitted, it is possible to generate a pulse signal. That is, it is possible to transmit the all-zero binary transmit data, and the all-one binary transmit data. Further, even if the signal is transformed due to some cause, the original data can accurately be recognized in the receiving system as long as the original data is not carried up or is not carried down.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Embodiment 1

Figure 1:
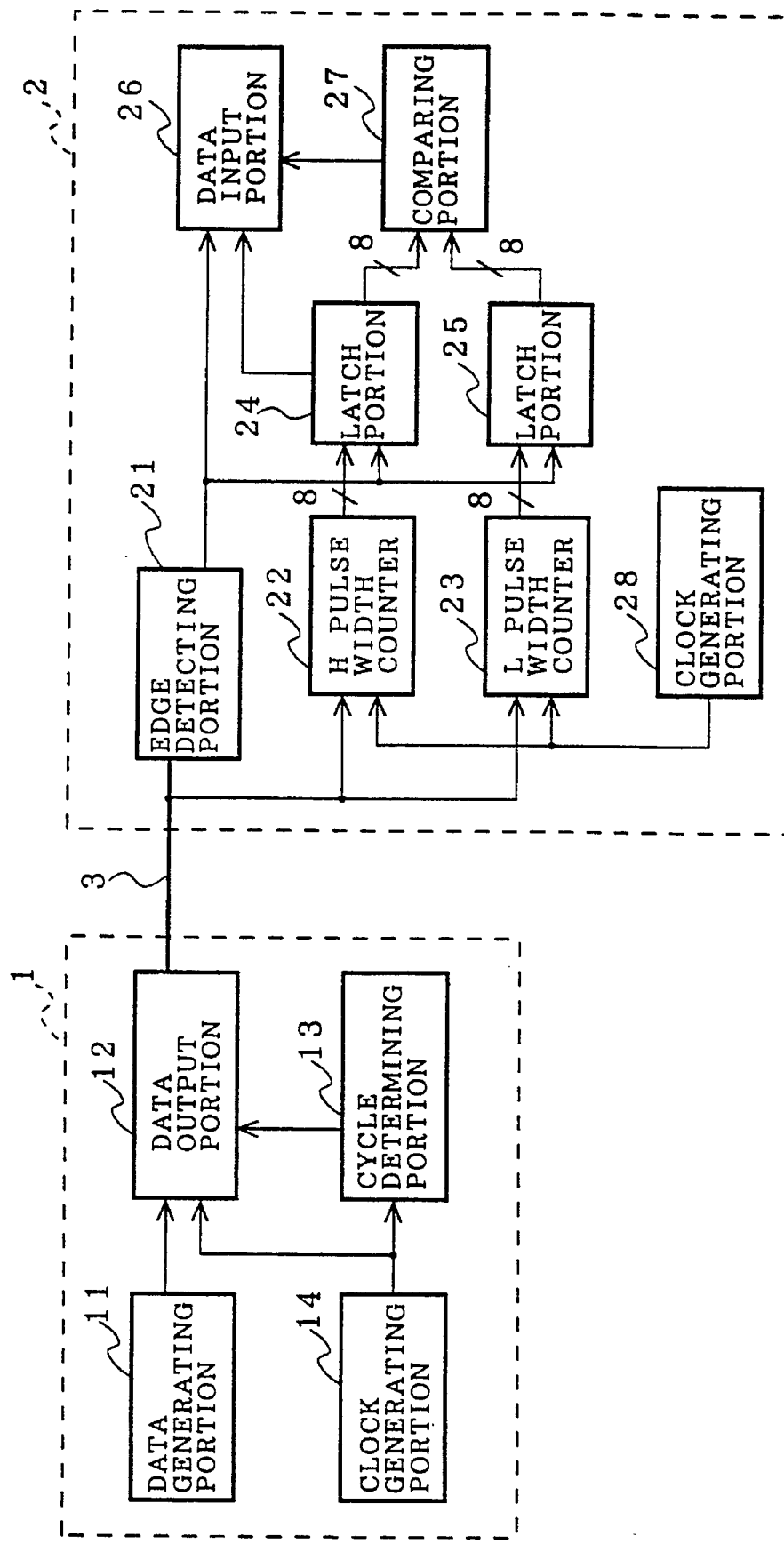
FIG. 1 is a block diagram showing a structure of a PWM communication system according to a first embodiment of the present invention.

FIG. 1 is a block diagram showing a structure of a PWM communication system according to a first embodiment of the present invention. In the drawing, reference numeral 1 means a transmitting system, 2 is a receiving system, and 3 is a transmission line to transfer data. In the transmitting system 1, reference numeral 11 means a data generating portion to generate data, 12 is data output portion to generate a PWM signal corresponding to the data from the data generating portion 11, 13 is a cycle determining portion to determine a cycle on which one data is transferred, and 14 is a clock generating portion to feed a clock signal to the data output portion 12 and the cycle determining portion 13. Here, the combination of the data output portion 12 and the cycle determining portion 13 are an illustrative embodiment of a signal transmitting circuit.

In the receiving system 2, reference numeral 21 represents an edge detecting portion to take the PWM signal as input from the transmission line 3 so as to detect a fall and a rise of the PWM signal, 22 is an H pulse width counter to take the PWM signal as input from the transmission line 3 so as to measure a length of a high level period in the PWM signal, 23 is an L pulse width counter to take the PWM signal as input from the transmission line 3 so as to measure a length of a low level period in the PWM signal, 24 is a latch portion to latch a count value of the H pulse width counter 22, and 25 is a latch portion to latch a count value of the L pulse width counter 23. Further, reference numeral 27 is a comparing portion to compare a value latched by the latch portion 24 with a value latched by the latch portion 25 after any one of the values is inverted, and output an error signal in case of a mismatch, 26 is a data input portion to receive the value latched by the latch portion 24 as a received data length, and detect the error signal from the comparing portion 27, and 28 is a clock generating portion to feed a clock signal to the H pulse width counter 22 and the L pulse width counter 23. The clock signal from the clock generating portion 28 has the same frequency as that of the clock signal outputted from the clock generating portion 14 in the transmitting system 1. Here, the combination of the H pulse width counter 22 and the L pulse width counter 23 are an illustrative embodiment of pulse width measuring circuit, and the comparing portion 27 is one illustrative embodiment of comparing circuit.

Figure 2:
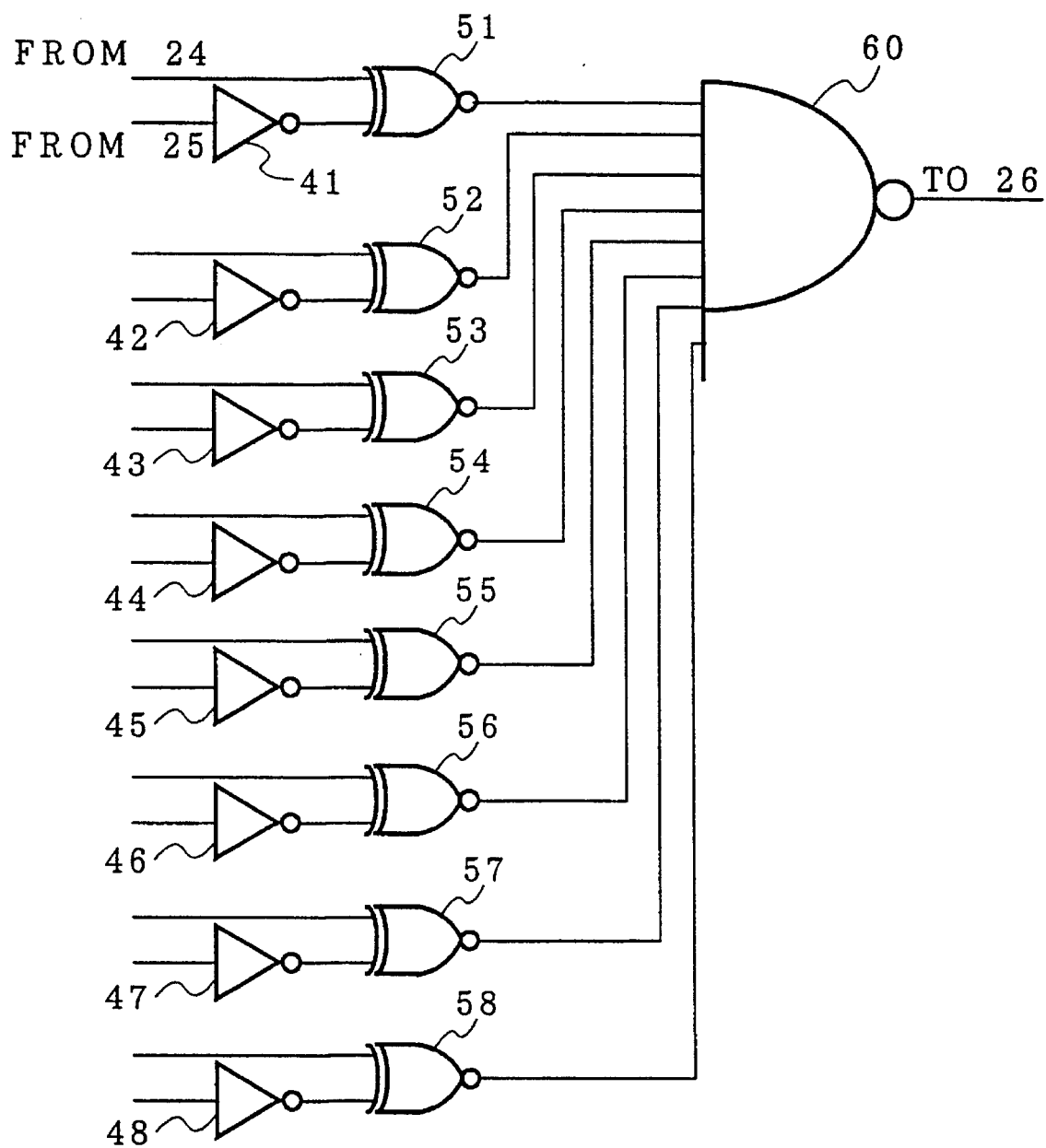
FIG. 2 is a circuit diagram showing an illustrative structure of a comparing portion.

FIG. 2 is a circuit diagram showing an illustrative structure of the comparing portion 27. As shown in the drawing, the comparing portion 27 includes eight exclusive NOR (EXNOR) circuits 51 to 58 having one-bit output from the latch portion 24 as one input, inverting (NOT) circuits 41 to 48 to invert and feed one-bit output from the latch portion 25 to the other input of the corresponding EXNOR circuits 51 to 58, and an inverting AND (NAND) circuit 60 in which output from the EXNOR circuits 51 to 58 are logically multiplied. Here, the NAND circuit 60 is one illustrative embodiment of a comparator.

Next, a description will now be given of the operation by way of transmission of eight-bit data as one example. A pulse having a pulse width corresponding to a value of data is transmitted as the PWM signal. In this example, the value of data is set to correspond to a high level period of a pulse in a PWM signal. Further, each data is transmitted within one cycle including 255 pulses of the clock signal from the clock generating portion 14. Consequently, it is possible to transmit each data having each value corresponding to the pulse number "1" to the pulse number "254."

The data generating portion 11 transmits to the data output portion 12 the eight-bit data to be transmitted. The cycle determining portion 13 counts the number of pulses from the clock generating portion 14, and feeds a one cycle starting signal to the data output portion 12 each time the count value becomes 255. The data output portion 12 receives the one cycle starting signal from the cycle determining portion 13, and sets a signal outputted to the transmission line 3 in a rise state if any data is inputted from the data generating portion 11. Further, the data output portion 12 counts the number of pulses of the clock signal from the clock generating portion 14, and sets the signal outputted to the transmission line 3 in a fall state if the count value is identical with the data inputted from the data generating portion 11. Subsequently, when the data output portion 12 receives the one cycle starting signal from the cycle determining portion 13, the data output portion 12 sets the signal outputted to the transmission line 3 in the rise state. According to the above operation, it is possible to complete the step of outputting the PWM signal corresponding to one data to the transmission line 3, and start transmission of the next data.

If there is no data to be subsequently transmitted, low data or appropriate dummy data may be placed on the transmission line 3.

Figure 3:
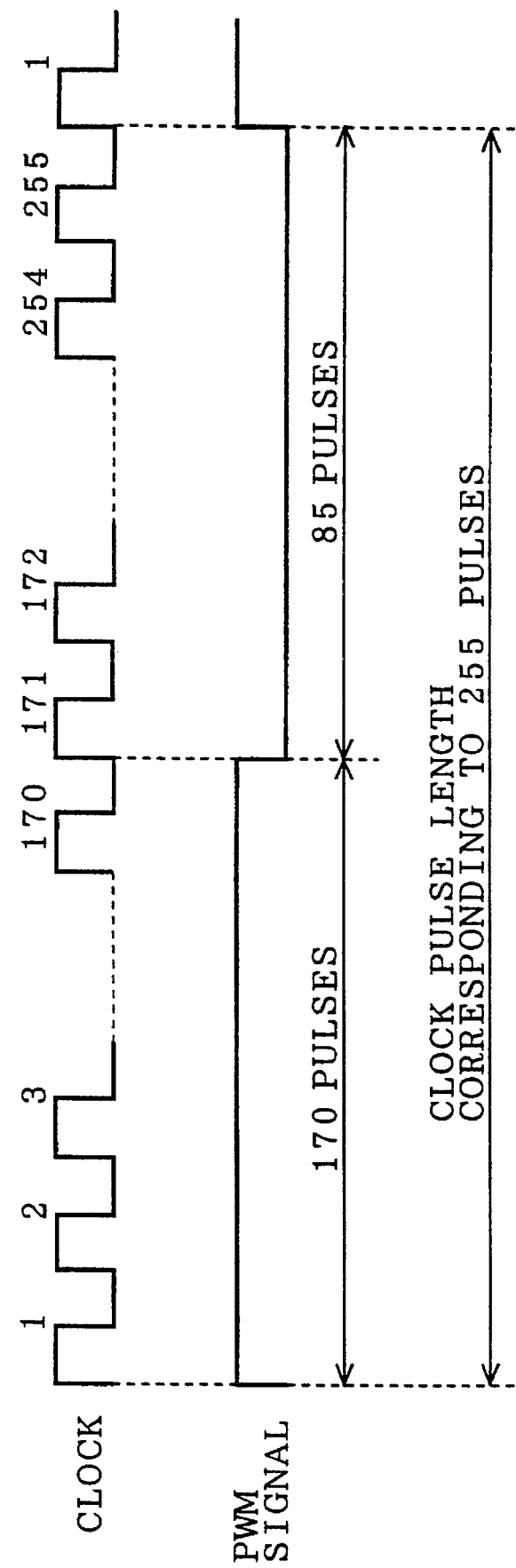
FIG. 3 is a timing diagram in which data "AA(H)" is transmitted through a PWM signal.

FIG. 3 is a timing diagram in which data "AA(H)" is transmitted through a PWM signal. "(H)" as used herein means hexadecimal number. As shown in the drawing, high level signal is outputted to the transmission line 3 for a period corresponding to 170 pulses (=AA(H)) outputted from the clock generating portion 14. Further, low level signal is outputted to the transmission line 3 for a period corresponding to "FF(H)"–"AA(A)"="55(H)" pulses, that is, "85(D)" pulses. "(D)" as used herein means decimal number.

In the receiving system 2, the H pulse width counter 22 uses the clock signal from the clock generating portion 28 to measure a length of the high level period of the signal on the transmission line 3. That is, the H pulse width counter 22 counts the number of pulse from the clock generating portion 28 for a period for which the signal on the transmission line 3 is kept high level. The count value of the H pulse width counter 22 is latched by the latch portion 24 when the edge detecting portion 21 detects a fall of the signal on the transmission line 3.

Further, the L pulse width counter 23 uses the clock signal from the clock generating portion 28 to measure a length of a low level period of the signal on the transmission line 3. That is, the L pulse width counter 23 counts the number of pulse from the clock generating portion 28 for a period for which the signal on the transmission line 3 is kept low level. The count value of the L pulse width counter 23 is latched by the latch portion 25 when the edge detecting portion 21 detects a rise of the signal on the transmission line 3. In this case, the H pulse width counter 22 and the L pulse width counter 23 are eight-bit counters, and the count values represented by eight bits are latched by the latch portions 24 and 25. Subsequently, eight-bit data are respectively inputted into the comparing portion 27 from the latch portions 24 and 25.

In the comparing portion 27, one bit among data from the latch portion 24 are introduced into one input of the EXNOR circuits 51 to 58. Here, among the data from the latch portion 24, the X-th bit is introduced into the EXNOR circuit 5X (X in the range from 1 to 8). Data from the latch portion 25 are inverted by the NOT circuits 41 to 48, and are thereafter introduced into the other input of the EXNOR circuits 51 to 58. Among the data from the latch portion 25, the X-th bit is introduced into the NOT circuit 4X (X in the range from 1 to 8).

"FF(H)" can be obtained as the sum of the number of pulses from the clock generating portion 14 for the high level period in the PWM signal outputted from the transmitting system 1, and the number of pulses from the clock generating portion 14 for the low level period. That is, in binary notation, the number of pulses for the high level period is equivalent to the one's complement of the number of pulses for the low level period.

In the clock signal used for measurement of the length of period by the H pulse width counter 22 and the L pulse width counter 23, the frequency is identical with a frequency of the clock signal used at a time of production of the PWM signal in the transmitting system 1. Thus, "FF(H)" should be obtained as the sum of the number of pulses from the clock generating portion 28 for the high level period in the received PWM signal, and the number of pulses from the clock generating portion 28 for the low level period. In other words, in binary notation, the number of pulses from the clock generating portion 28 for the high level period should be equivalent to the one's complement of the number of pulses from the clock generating portion 28 for the low level period.

The EXNOR circuits 51 to 58 compare the output from the latch portion 24 with output from the latch portion 25 through the NOT circuits 41 to 48, that is, compare the number of pulses from the clock generating portion 28 for the high level period in the received PWM signal with the one's complement of the number of pulse from the clock generating portion 28 for the low level period. In case of a match of both outputs, all the EXNOR circuits 51 to 58 output high signals. In this case, the NAND circuit 60 outputs a low signal. If inputted values are not identical in one or more circuits among the EXNOR circuits 51 to 58, the NAND circuit 60 outputs a high signal. That is, when "FF(H)" can not be obtained as the sum of the number of pulses from the clock generating portion 28 for the high level period in the received PWM signal and the number of pulses from the clock generating portion 28 for the low level period, the NAND circuit 60 outputs the high signal as an error signal.

When the edge detecting portion 21 detects a fall (i.e., an end point of the high level period of the signal on the transmission line 3), or detects a rise (i.e., an end point of one cycle), the data input portion 26 takes as input the value latched by the latch portion 24. The value is equivalent to a value of the received data. Further, when the edge detecting portion 21 detects a rise, the data input portion 26 confirms whether or not an error signal is outputted from the comparing portion 27. If no error signal is outputted, the data input portion 26 can regard the received data as a correct value. If the error signal is outputted, the data input portion 26 can recognize that erroneous data is received due to, for example, noise in the transmission line 3.

The output from the latch portion 25 is inverted and is thereafter inputted into the EXNOR circuits 51 to 58 in the embodiment. However, it is to be noted that the output from the latch portion 24 may be inverted instead of the output from the latch portion 25.

As set forth above, it is possible to surely detect an error of data in the receiving system by detecting whether or not the sum of the high level period and the low level period in the received PWM signal is identical with original one cycle. In particular, when the one cycle corresponds to $[2^n-1]$ pulses in the clock signal (n being a positive integer), it is possible to easily detect the error of data by, as in the embodiment, inverting any one of the count value corresponding to the high level period and the count value corresponding to the low level period, and thereafter comparing the values.

Embodiment 2

Figure 4:
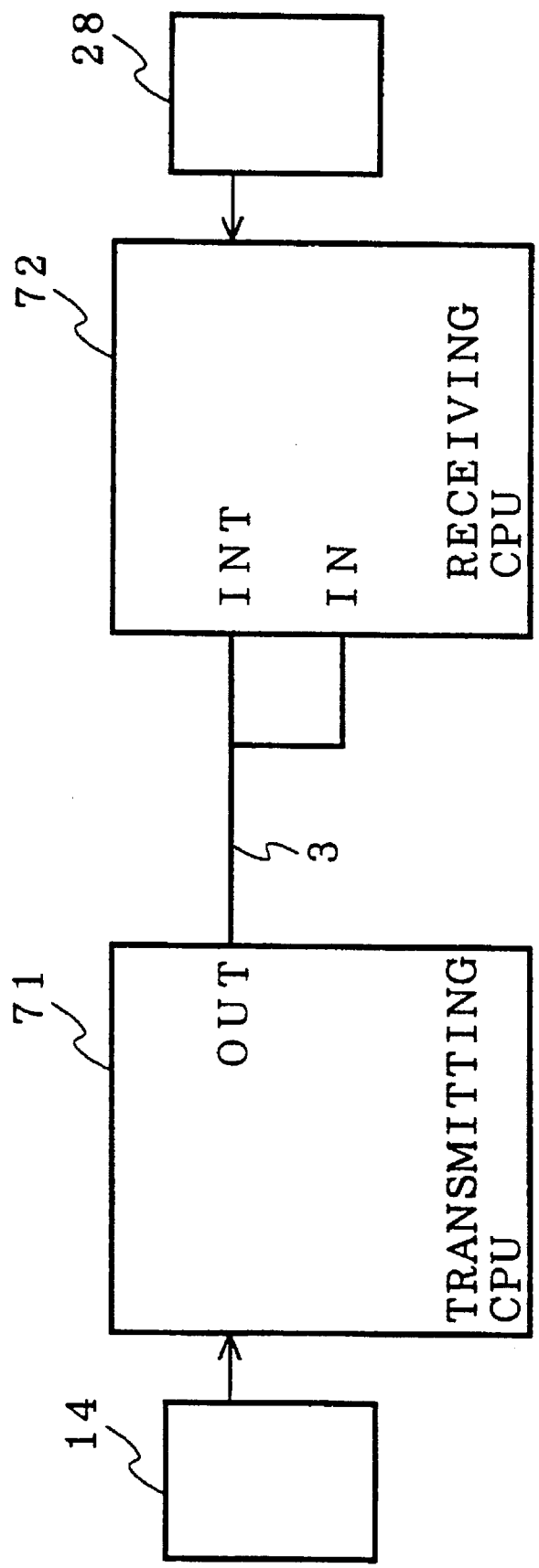
FIG. 4 is a block diagram showing a structure of a PWM communication system according to a second embodiment of the present invention.

FIG. 4 is a block diagram showing a structure of a PWM communication system according to a second embodiment of the present invention. In the drawing, reference numeral 71 refers a transmitting CPU, 72 is a receiving CPU, and 3 is a transmission line to transfer data. As in the previous embodiment, reference numerals 14 and 28 are clock generating portions. In this case, a PWM signal is transmitted through a universal I/O port built in the CPU, and is received through a universal I/O port and an interrupt terminal. Here, the transmitting CPU 71 is one illustrative embodiment of signal transmitting circuit, and the receiving CPU 72 is one illustrative embodiment of comparing circuit.

Figure 5:
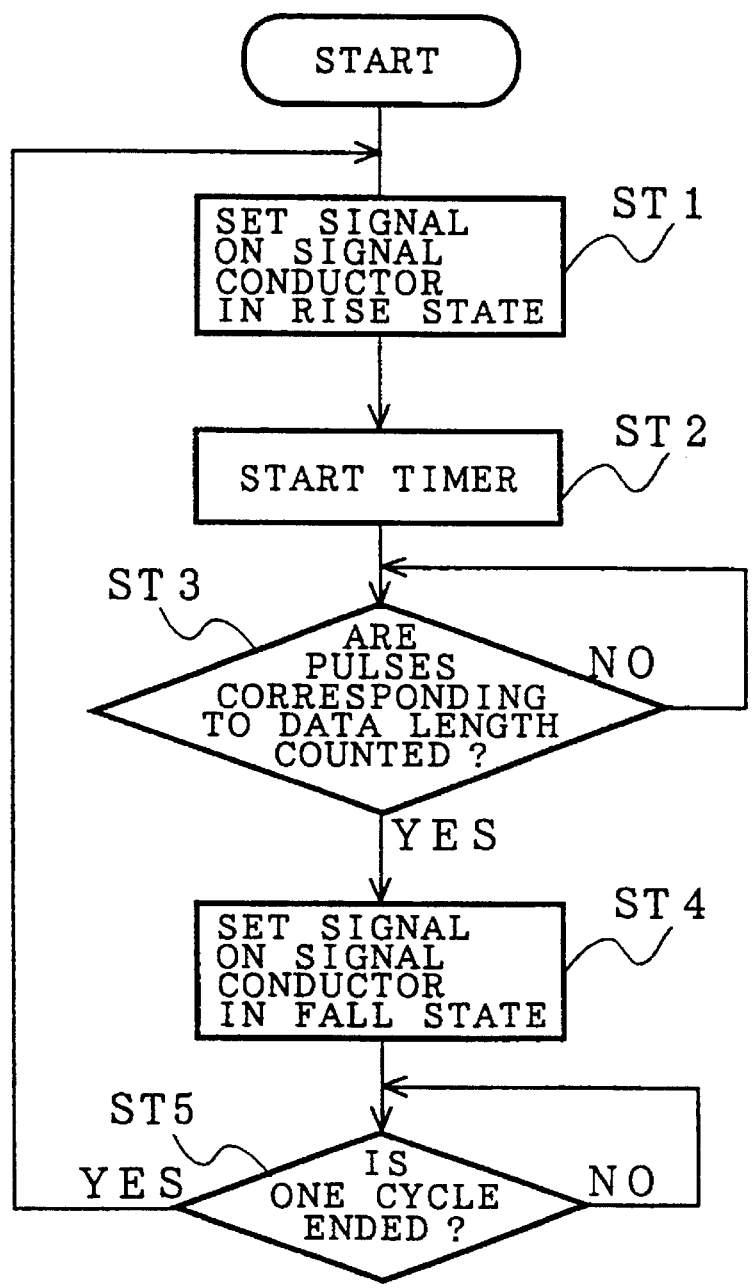
FIG. 5 is a flowchart showing the operation of a transmitting CPU in the PWM communication system according to the second embodiment of the present invention.

Referring now to flowcharts of FIGS. 5 and 6, a description will now be given of the operation. As in the above embodiment, it is assumed that one cycle corresponds to 255 pulses. FIG. 5 is a flowchart showing the operation of the transmitting CPU 71. The transmitting CPU 71 sets a signal on the transmission line 3 in a rise state through the output port at a starting time of one cycle (Step ST1). Then, an internal timer is started (Step ST2). The timer directly uses a clock signal from a clock generating portion 14, or uses the clock signal by dividing its frequency. When the timer counts pulses corresponding to a data length, the transmitting CPU 71 sets the signal on the transmission line 3 in a fall state through the output port (Steps ST3 and ST4). Further, when the timer counts pulses corresponding to the one cycle, the process returns to Step ST1 in the transmitting CPU 71 (Step ST5). As described above, it is also possible to transmit the PWM signal through software processing.

Figure 6:
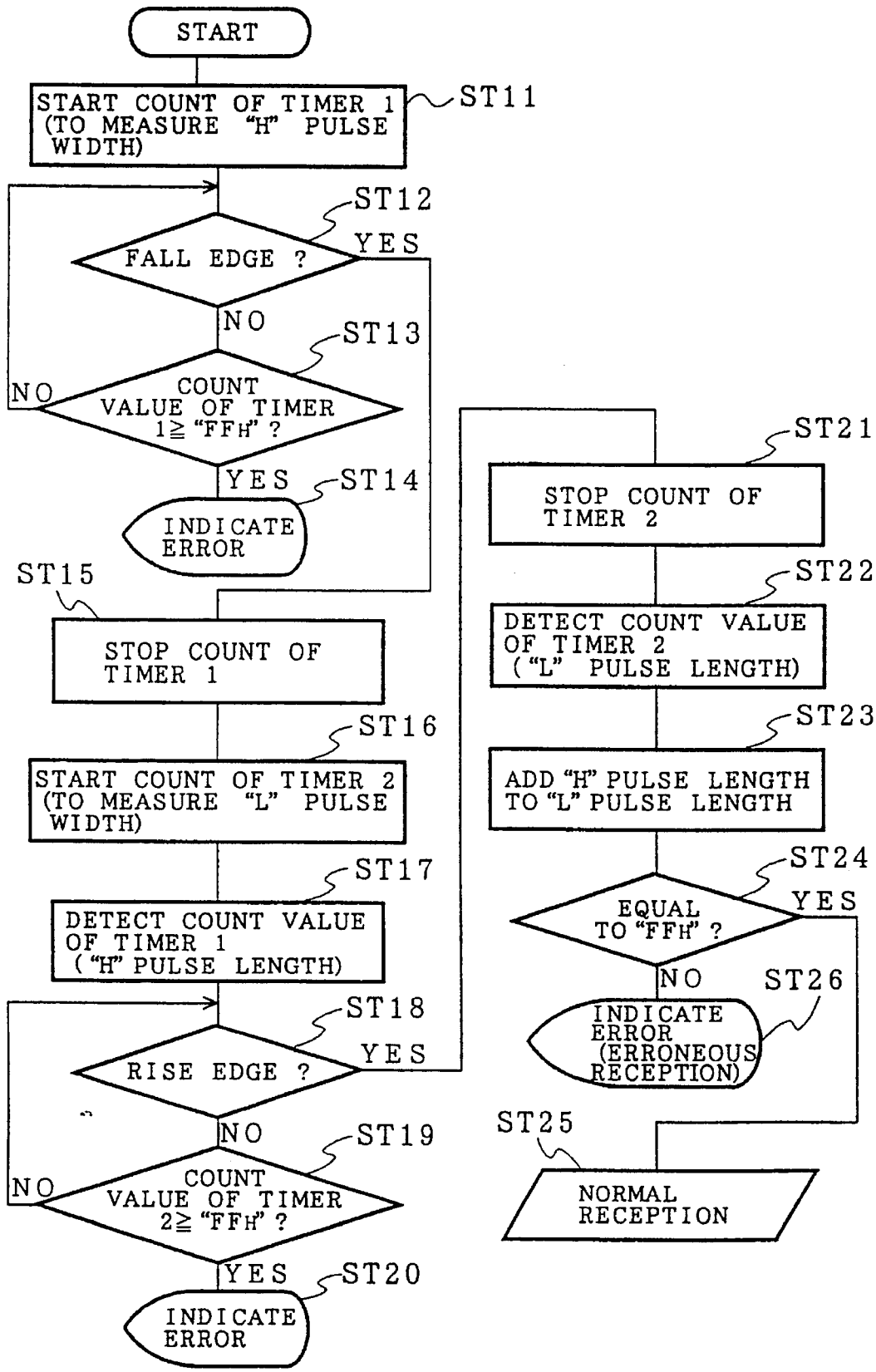
FIG. 6 is a flowchart showing the operation of a receiving CPU in the PWM communication system according to the second embodiment of the present invention.

FIG. 6 is a flowchart showing the operation of the receiving CPU 72. As shown in FIG. 4, in the receiving CPU 72, the transmission line 3 is introduced into the input port, and the interrupt terminal to detect generation of interruption by a rise edge. The processing shown in FIG. 6 is started when an initial variation is caused in a rise of a signal inputted into the interrupt terminal. When the variation is caused in the rise of the signal inputted into the interrupt terminal, the receiving CPU 72 starts a first internal timer (Step ST11). The internal timer in the receiving CPU 72 directly uses a clock signal from a clock generating portion 28, or uses the clock signal by dividing its frequency. As set forth above, the clock signal from the clock generating portion 28 has the same frequency as that of the clock signal from the clock generating portion 14 in the transmitting system. Further, the internal timer in the receiving CPU 72 counts starting from zero.

The receiving CPU 72 takes as input the signal on the transmission line 3 through the input port, and monitors whether or not the signal falls. When the first timer counts "FF(H)" without a fall edge developed in the signal on the transmission line 3 (Step ST13), the receiving CPU 72 decides that an error is caused in the transmitted PWM signal, and indicates an error (Step ST14). A high level period in the PWM signal is less than the number of pulses "FF(H)." Therefore, when the high level period of the signal on the transmission line 3 is kept for a period of the number of pulse "FF(H)" or more, the receiving CPU 72 can recognize that the error is caused.

If the fall edge is developed in the signal on the transmission line 3 (Step ST12), the receiving CPU 72 stops a counting operation of the first internal timer (Step ST15). Subsequently, a second internal timer is started to measure a time of a low level period of the signal on the transmission line 3 (Step ST16). At the same time, the count value of the first internal timer is detected (Step ST17).

When the second internal timer counts "FF(H)" without a rise edge developed in the signal on the transmission line 3 (Step ST19), the receiving CPU 72 decides that an error is caused in the transmitted PWM signal, and indicates an error (Step ST20). When the rise edge is developed in the signal on the transmission line 3 (Step ST18), the receiving CPU 72 stops a counting operation of the second internal timer (Step ST21). Then, the count value of the second internal timer is detected (Step ST22). The receiving CPU 72 adds the count value of the second internal timer representing a length of the low level period of the signal on the transmission line 3, to the count value of the first internal timer obtained in Step ST17, representing a length of the high level period (Step ST23).

If the resultant sum is "FF(H)," the receiving CPU 72 recognizes that the received data is normal (Steps ST24 and ST25). "Received data" as used herein means data whose data length is represented by the count value obtained in Step ST17. If the resultant sum is not "FF(H)," this shows that one cycle of the received PWM signal is different from a regular one cycle due to some cause. Thus, the receiving CPU 72 recognizes that the received data is not normal. Thereafter, the receiving CPU 72 indicates an error (Step ST26).

As described above, it is also possible to surely detect an error of data through software processing. Though a description has been given of the two internal timers in the embodiment, one internal timer may be provided to serve as both the internal timers.

Embodiment 3

A length of one cycle is set according to the maximum value of transmitted data. Hence, when many types of data are transmitted, the length of one cycle should be extended, resulting in an extended time period required for data transfer. For example, when a clock signal to create a PWM signal has a frequency of 5 MHz, the clock signal has a cycle of 0.2 microseconds. Therefore, in order to transmit eight-bit data, the PWM signal has one cycle of 51 (0.2×255) microseconds. However, it is possible to transmit the data in a short time period by dividing the data before the transmission.

Figure 7:
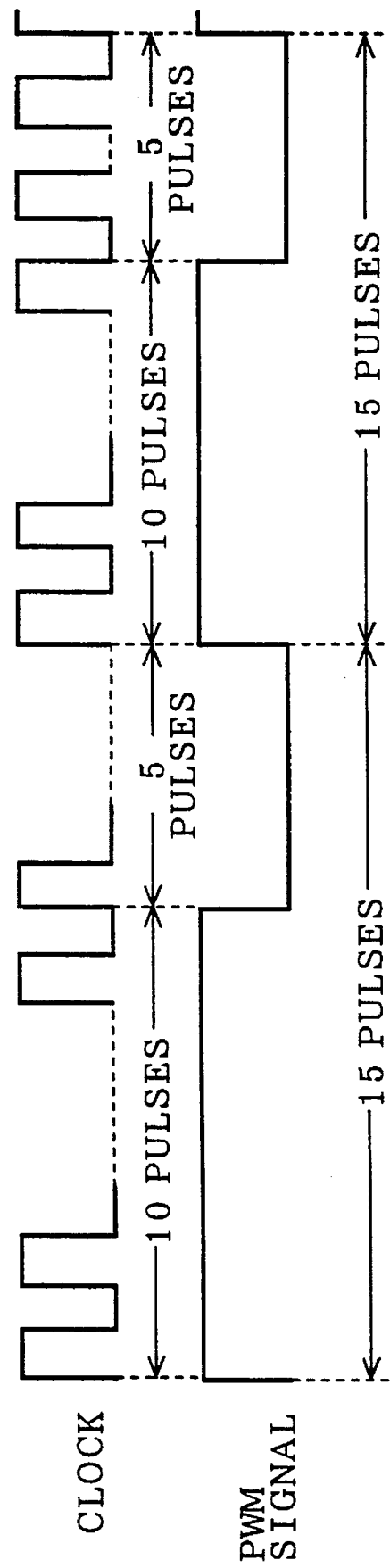
FIG. 7 is a timing diagram showing a PWM signal in case where the data "AA(H)" is transmitted after bisection of the data.

A description will now be given of a case where data is transmitted after bisection of the data. FIG. 7 is a timing diagram showing a PWM signal in a case where the data "AA(H)" is transmitted after the bisection of the data. As shown in the drawing, four high order bits of the data are initially transmitted as one data. Subsequently, four low order bits are transmitted as one data. According to the method, when the clock signal to create the PWM signal has the frequency of 5 MHz, the eight-bit data can completely be transmitted for a time of 6 microseconds (=0.2×15×2).

Figure 8:
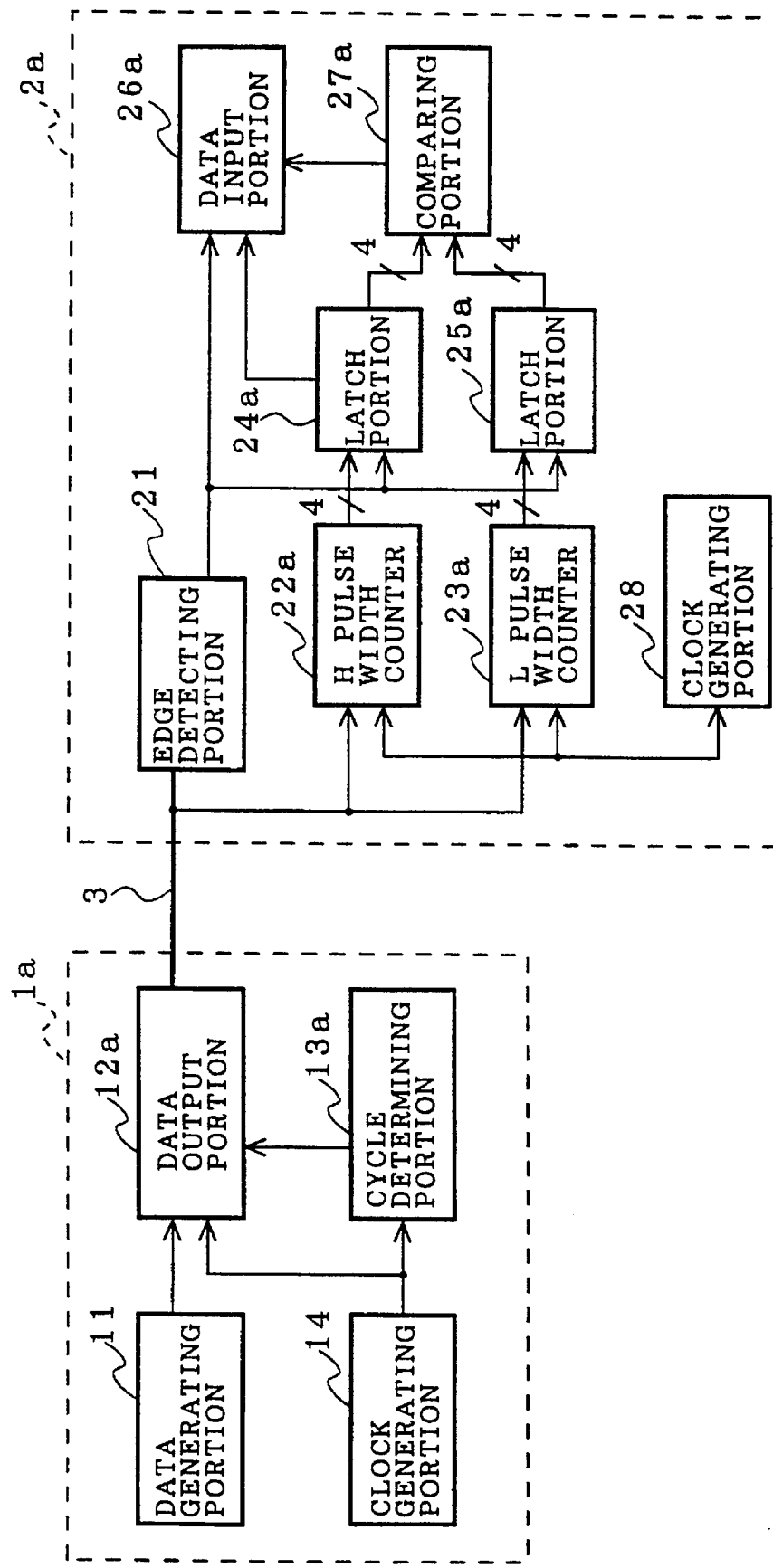
FIG. 8 is a block diagram showing a structure of a PWM communication system according to a third embodiment of the present invention.

FIG. 8 is a block diagram showing one illustrative embodiment in which the above method can be carried out. As in the above discussion, a description will be given by way of transmission of the eight-bit data as one example. A structure in FIG. 8 is different from the structure shown in FIG. 1 in the following points. That is, in a transmitting system 1a, data inputted into a data output portion 12a is divided into two data including four bits, and is thereafter transmitted. Further, a cycle determining portion 13a outputs a one cycle starting signal when 15 pulses are counted. In a receiving system 2a, an H pulse width counter 22a and an L pulse width counter 23a are four-bit counters, and latch portions 24a and 25a respectively output four-bit data to a comparing portion 27a. Further, a data input portion 26a regenerates one eight-bit data by combining the two four-bit data inputted from the latch portion 24a. Here, the combination of the data output portion 12a and the cycle determining portion 13a are an illustrative embodiment of signal transmitting circuit. The H pulse width counter 22a and the combination of the L pulse width counter 23a are an illustrative embodiment of a pulse width counter, and the comparing portion 27a is one illustrative embodiment of comparing circuit.

Figure 9:
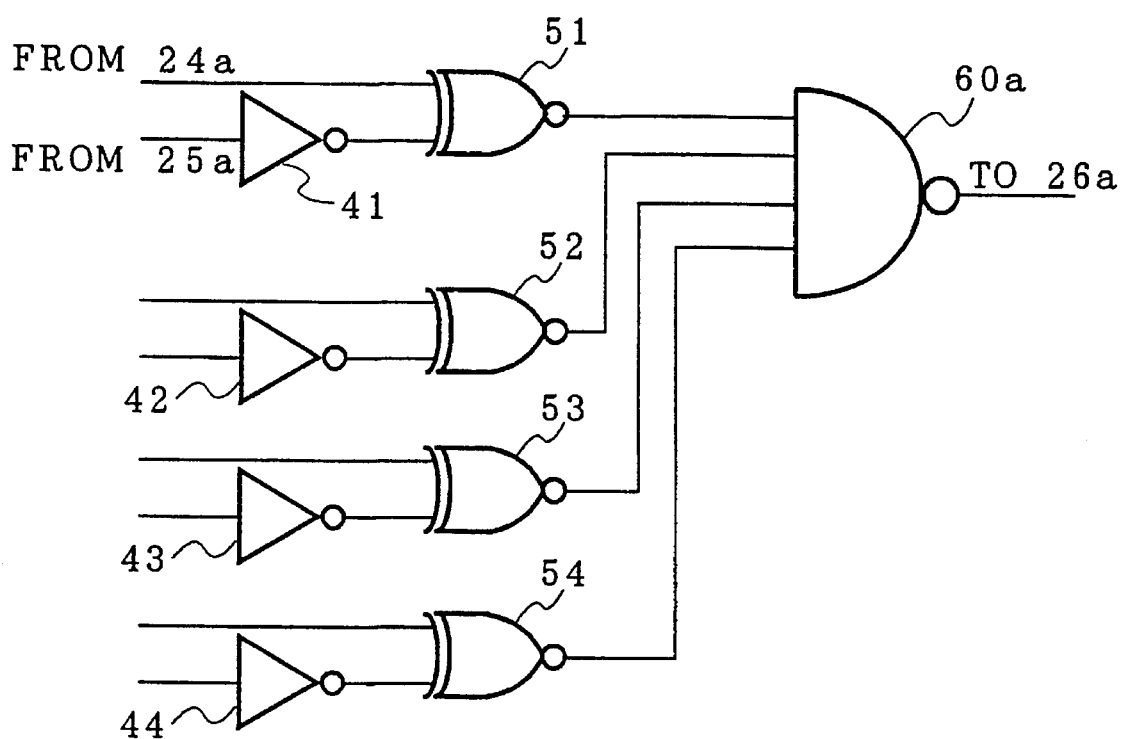
FIG. 9 is a circuit diagram showing an illustrative structure of a comparing portion in the third embodiment.

As shown in FIG. 9, the comparing portion 27a includes four EXNOR circuits 51 to 54 having one-bit output from the latch portion 24a as one input, NOT circuits 41 to 44 to invert and feed one-bit output from the latch portion 25a to the other input of the corresponding EXNOR circuits 51 to 54, and a NAND circuit 60a in which output from the EXNOR circuits 51 to 54 is logically multiplied. Here, the NAND circuit 60 is one illustrative embodiment of a comparing circuit.

Next, a description will now be given of the operation. In a transmitting system 1a, a data generating portion 11 sends to the data output portion 12a eight-bit data to be transmitted. The cycle determining portion 13a counts the number of pulses from the clock generating portion 14, and feeds the one cycle starting signal to the data output portion 12a each time the count value becomes 15. The data output portion 12a receives the one cycle starting signal from the cycle determining portion 13a, and sets a signal outputted to a transmission line 3 in a rise state if any data is inputted from the data generating portion 11. Further, the data output portion 12a counts the number of pulse of a clock signal from the clock generating portion 14, and sets the signal outputted to the transmission line 3 in a fall state if the count value is identical with a value of data represented by four high order bits of the eight-bit data inputted from the data generating portion 11.

Subsequently, when the data output portion 12a receives the one cycle starting signal from the cycle determining portion 13a, the data output portion 12a sets the signal outputted to the transmission line 3 in the rise state, and newly starts to count pulses of the clock signal from the clock generating portion 14. Further, the data output portion 12a counts the number of pulses of the clock signal outputted from the clock generating portion 14, and sets the signal outputted to the transmission line 3 in a fall state if the count value is identical with a value of data represented by four low order bits of the eight-bit data inputted from the data generating portion 11. Subsequently, when the data output portion 12a receives the one cycle starting signal from the cycle determining portion 13a, the data output portion 12a sets the signal outputted to the transmission line 3 in the rise state. According to the above operation, it is possible to place the PWM signal corresponding to the one eight-bit data on the transmission line 3, and start transmission of the next data.

In the receiving system 2a, the H pulse width counter 22a uses a clock signal from a clock generating portion 28 to measure a length of a high level period of the signal on the transmission line 3. The count value of the H pulse width counter 22a is latched by the latch portion 24a when an edge detecting portion detects a fall of the signal on the transmission line 3.

Further, the L pulse width counter 23a uses the clock signal from the clock generating portion 28 to measure a length of a low level period of the signal on the transmission line 3. The count value of the L pulse width counter 23a is latched by the latch portion 25a when the edge detecting portion detects a rise of the signal on the transmission line 3. Four-bit data are respectively inputted into the comparing portion 27a from the latch portions 24a and 25a.

In the comparing portion 27a, one bits among data from the latch portion 24a are introduced into one input of the EXNOR circuits 51 to 54. Data from the latch portion 25a are inverted by the NOT circuits 41 to 44, and are thereafter introduced into the other input of the EXNOR circuits 51 to 54.

"OF(H)" can be obtained as the sum of the number of pulse from the clock generating portion 14 for the high level period in the PWM signal outputted from the transmitting system 1a, and the number of pulses from the clock generating portion 14 for the low level period. "OF(H)" should be obtained as the sum of the number of pulses from the clock generating portion 28 for a high level period in the received PWM signal, and the number of pulses from the clock generating portion 28 for the low level period.

The EXNOR circuits 51 to 54 compare the output from the latch portion 24a with the output from the latch portion 25a, that is, compare the number of pulses from the clock generating portion 28 for the high level period in the received PWM signal with the one's complement of the number of pulse from the clock generating portion 28 for the low level period. In case of a match of both the output, all the EXNOR circuits 51 to 54 output high signals. In this case, the NAND circuit 60a outputs a low signal. If inputted values are not identical in one or more circuits among the EXNOR circuits 51 to 54, the NAND circuit 60a outputs a high signal. That is, when "OF(H)" can not be obtained as the sum of the number of pulses from the clock generating portion 28 for the high level period in the received PWM signal and the number of pulses from the clock generating portion 28 for the low level period, the NAND circuit 60a outputs the high signal as an error signal.

In addition, in the edge detecting portion 21, the H pulse width counter 22a, the L pulse width counter 23a, the latch portions 24a and 25a, and the comparing portion 27a, the above processing is repeated with respect to a high level period and a low level period of a subsequently received signal.

When the edge detecting portion 21 detects a fall (i.e., an end point of the high level period of the signal on the transmission line 3), or detects a rise (i.e., an end point of one cycle), the data input portion 26a takes as input the value latched by the latch portion 24a. The value is equivalent to a value of the received four-bit data. Since the edge detecting portion 21 should detect the fall and the rise twice for each transmission of one eight-bit data, the data input portion 26a can obtain two four-bit data. Further, when the edge detecting portion 21 detects the rise, the data input portion 26a confirms whether or not an error signal is outputted from the comparing portion 27a. If no error signal is outputted, the data input portion 26a can regard the received data as a correct value. If the error signal is outputted, the data input portion 26a can recognize that erroneous data is received due to, for example, noise in the transmission line 3.

When the error signal is never outputted, the data input portion 26a regenerates the one eight-bit binary data by combining the two four-bit data.

The output from the latch portion 25a is inverted and is thereafter inputted into the EXNOR circuits 51 to 54 in the embodiment. However, it is to be noted that the output from the latch portion 24a may be inverted instead of the output from the latch portion 25a.

As set forth above, it is possible to reduce a time required for data transmission by bisecting the eight-bit data before the transmission. Further, it is possible to surely detect an error of data in the receiving system by detecting whether or not the sum of the high level period and the low level period in the received PWM signal is identical with original one cycle. Though a description has been given of the transmission of data after bisection of the data, it must be noted that the degree of division may be increased.

Embodiment 4

Figure 10:
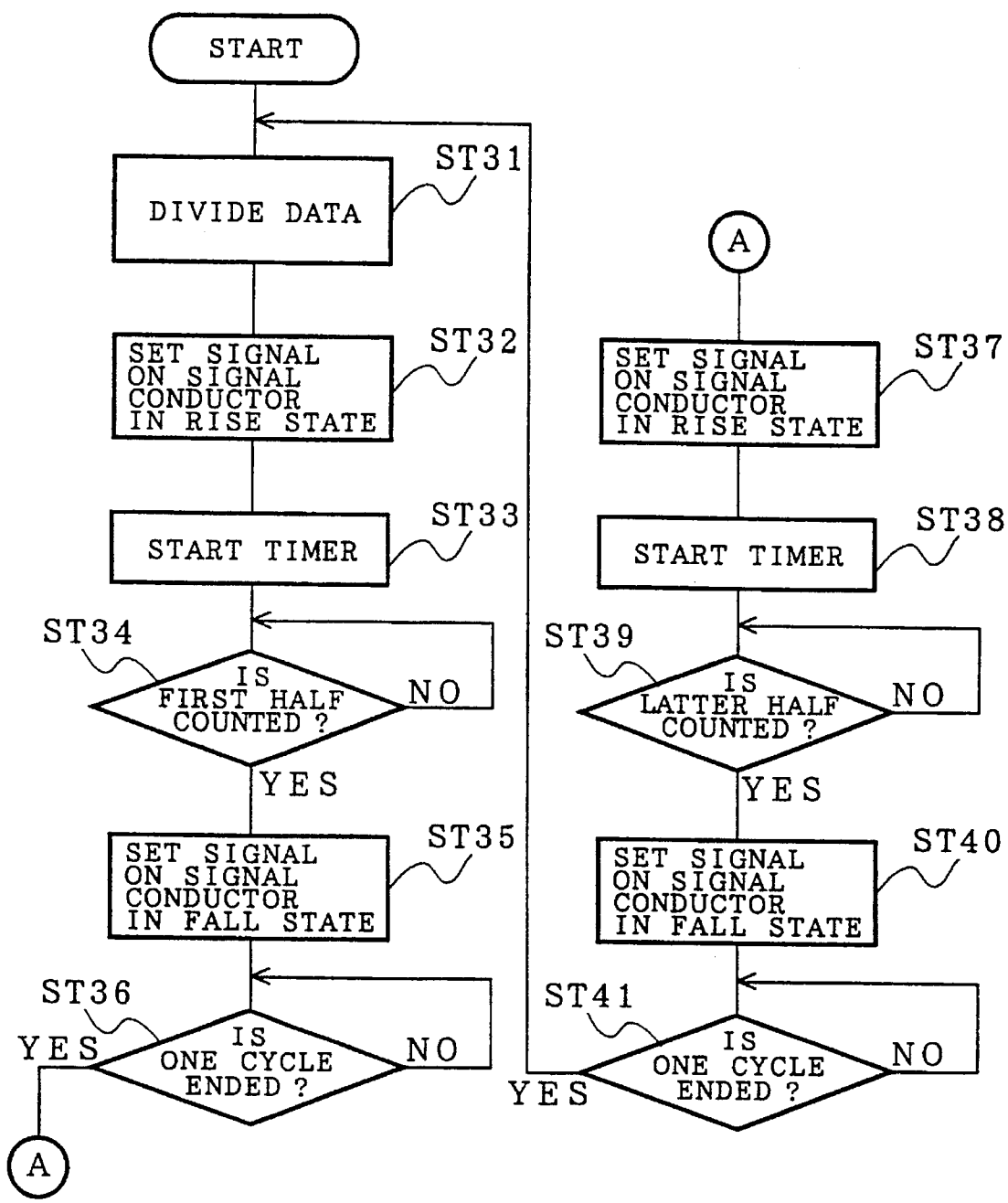
FIG. 10 is a flowchart showing the operation of a transmitting CPU in a PWM communication system according to a fourth embodiment of the present invention.

In the third embodiment, the method is implemented of bisecting and transmitting the data through the hardware. It is also possible to implement the same method through a software in the structure shown in FIG. 4. FIG. 10 is a flowchart showing the steps in the case where the method is implemented through the software.

A transmitting CPU 71 divides eight-bit data to be transmitted into high order four-bit data and low order four-bit data (Step ST31). At a starting time of one cycle, a signal on a transmission line 3 is set in a rise state through an output port (Step ST32). Further, an internal timer is started (Step ST33). The timer directly uses a clock signal from a clock generating portion 14, or uses the clock signal by dividing its frequency. When the timer counts pulses corresponding to a value represented by four high order bits in the eight-bit data, the transmitting CPU 71 sets the signal on the transmission line 3 in a fall state through the output port (Steps ST34 and ST35). Further, when the timer counts pulses corresponding to one cycle (Step ST36), the process proceeds to Step ST37 in the CPU.

In Steps ST37 to ST40, the transmitting CPU 71 repeats the same processing as that in Steps ST32 to 35 with respect to the value represented by the four low order bits in the eight-bit data. When the timer counts the pulses corresponding to the one cycle, the process returns to Step ST31 in the CPU.

According to the above operation, a PWM signal as shown in FIG. 7 is transmitted to the transmission line 3.

A receiving CPU 72 carries out the processing in the flowchart shown in FIG. 6 twice with respect to one eight-bit data. In this case, in Steps ST13, ST19, and ST24, "OF(H)" is used for comparison. Further, in the second Step ST25, the two four-bit data obtained in the second Step ST17 are combined to regenerate the one eight-bit data.

Embodiment 5

According to the above embodiments, when eight-bit data is "11111111" or "00000000," the data can not be transmitted because a PWM signal has no fall or no rise. Consequently, another embodiment is proposed in which one or more bits of dummy data is added to original binary data to be transmitted. The embodiment can be implemented by, for example, a structure shown in FIG. 4. In this case, a receiving CPU 72 implements pulse width measuring circuit and comparing circuit, and also implements a data restoring circuit.

Referring now to flowcharts in FIGS. 11 and 13, a description will now be given of the operation by way of four-bit data as one example of data to be transmitted. Further, a description will be given by way of a case where two-bit dummy data is added to a low-order bit position of the LSB of original data.

Figure 11:
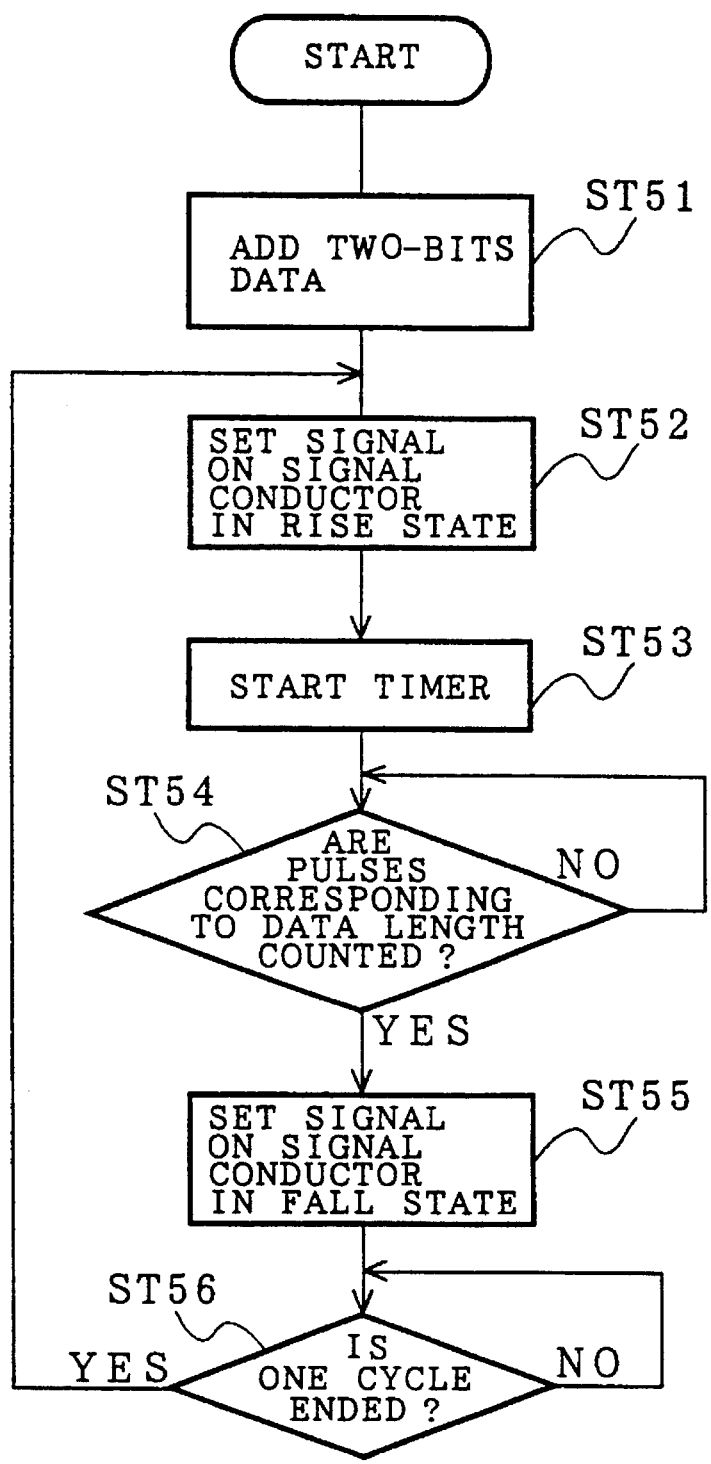
FIG. 11 is a flowchart showing the operation of a transmitting CPU in a PWM communication system according to a fifth embodiment of the present invention.

FIG. 11 is the flowchart showing the operation of a transmitting CPU 71. The transmitting CPU 71 adds the two-bit data "01(B)" to the low-order bit position of the LSB of the data. "(B)" as used herein means binary number. Therefore, a PWM signal corresponding to six-bit data is transmitted. Thereafter, the transmitting CPU 71 carries out the same processing as that in Steps ST1 to ST5 in the flowchart in FIG. 5 (Steps ST52 to ST56).

Figure 12:
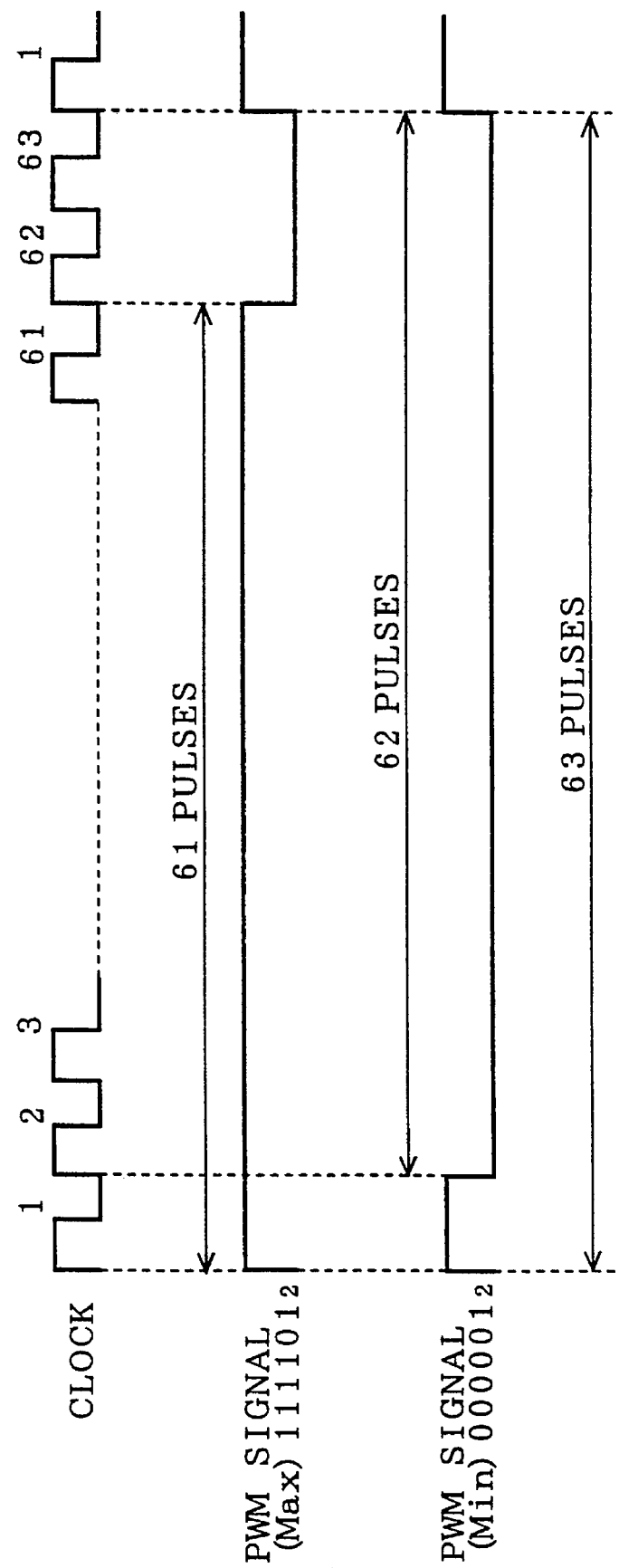
FIG. 12 is a timing diagram showing illustrative PWM signals in the PWM communication system according to the fifth embodiment of the present invention.

When the original data is "1111(B)," the PWM signal outputted to a transmission line 3 is a signal corresponding to "111101(B)=61(D)." When the original data is "0000(B)," the PWM signal outputted to the transmission line 3 is a signal corresponding to "000001(B)=01(D)." Hence, as shown in FIG. 12, when the original data is "1111(B)," a high level period corresponding to 61 pulses of a clock signal and a low level period corresponding to two pulses are developed on the transmission line 3 as the PWM signal.

When the original data is "0000(B)," a high level period corresponding to one pulse of the clock signal and a low level period corresponding to 62 pulses are developed on the transmission line 3 as the PWM signal.

Figure 13:
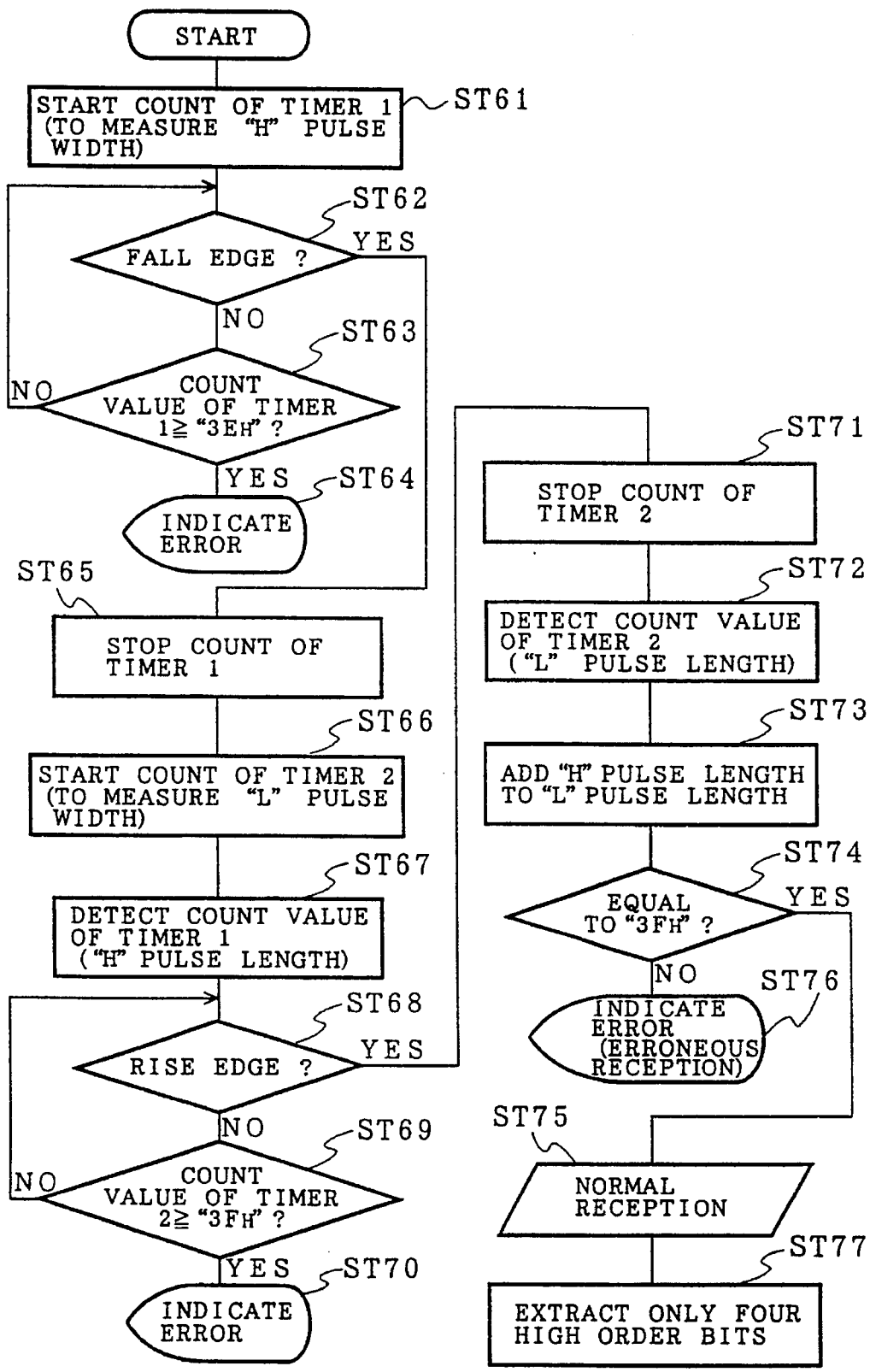
FIG. 13 is a flowchart showing the operation of a receiving CPU in the PWM communication system according to the fifth embodiment of the present invention.
Figure 14:
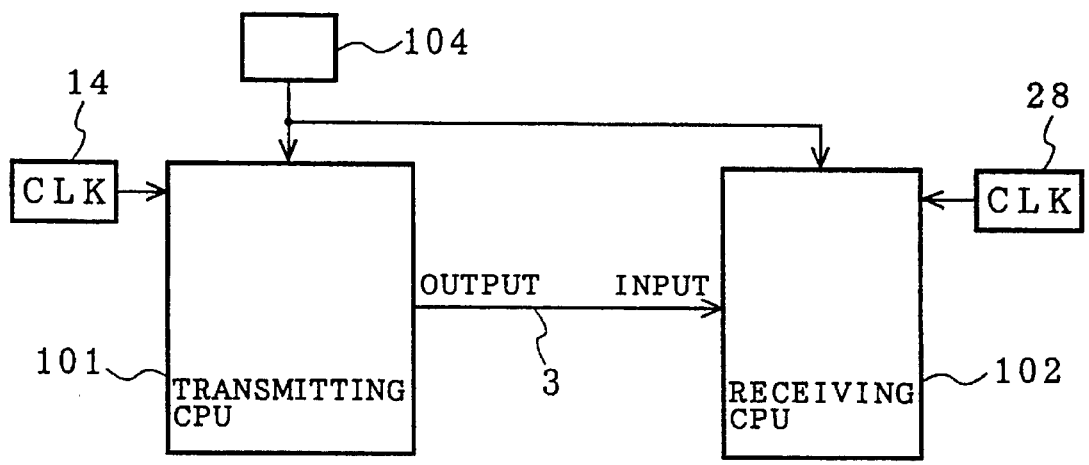
FIG. 14 is a block diagram showing a structure of a conventional PWM communication system.
Figure 15:
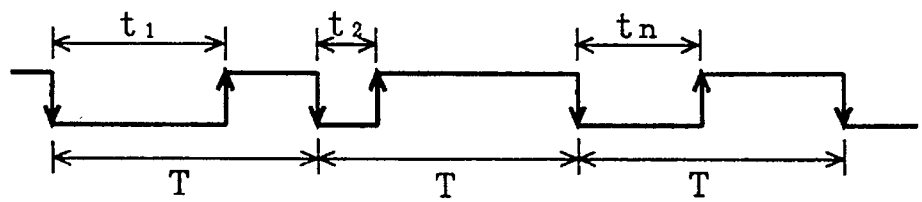
FIG. 15 is a timing diagram showing one illustrative conventional PWM signal.
Figure 16:
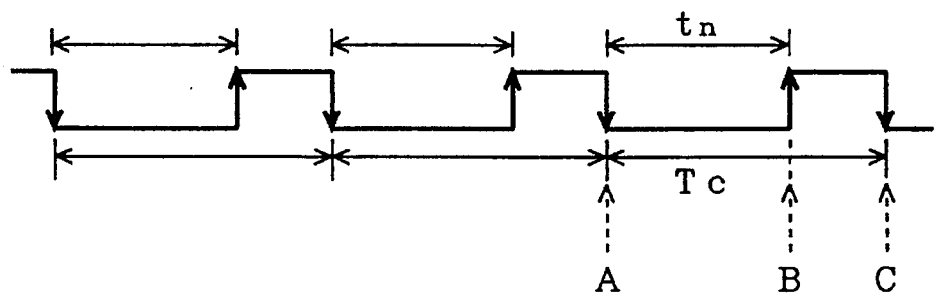
FIG. 16 is a timing diagram illustrating a method of correction of a received PWM signal.

FIG. 13 is a flowchart showing the operation of the receiving CPU 72. The processing shown in FIG. 13 is started when an initial variation is caused in a rise of a signal inputted into an interrupt terminal. When the variation is caused in the rise of the signal inputted into the interrupt terminal, the receiving CPU 72 starts a first internal timer (Step ST61).

The receiving CPU 72 takes as input the signal on the transmission line 3 through an input port, and monitors whether or not the signal falls. When the first timer counts "3E(H)" without a fall edge developed in the signal on the transmission line 3 (Step ST63), the receiving CPU 72 decides that an error is caused in the transmitted PWM signal, and indicates an error (Step ST64). As seen from FIG. 12, the maximum value of the high level period in the PWM signal includes 61 pulses (=3D(H)) of the clock signal. Therefore, when the count value of the first timer is equal to or more than "3E(H)," the receiving CPU 72 can recognize that some error is caused.

If the fall edge is developed in the signal on the transmission line 3 (Step ST62), the receiving CPU 72 stops a counting operation of the first internal timer (Step ST65). Subsequently, a second internal timer is started to measure a time of the low level period of the signal on the transmission line 3 (Step ST66). At the same time, the count value of the first internal timer is detected (Step ST67).

When the second internal timer counts "3F(H)" without a rise edge developed in the signal on the transmission line 3 (Step ST69), the receiving CPU 72 decides that an error is caused in the transmitted PWM signal, and indicates an error (Step ST70). As seen from FIG. 12, the maximum value of the low level period in the PWM signal includes 62 pulses (=3E(H)) of the clock signal. Therefore, when the count value of the second timer is equal to or more than "3E(H)," the receiving CPU 72 can recognize that some error is caused.

When the rise edge is developed in the signal on the transmission line 3 (Step ST68), the receiving CPU 72 stops a counting operation of the second internal timer (Step ST71). Then, the count value of the second internal timer is detected (Step ST72). The receiving CPU 72 adds the count value of the second internal timer representing a length of the low level period of the signal on the transmission line 3 to the count value of the first internal timer obtained in Step ST67, representing a length of the high level period (Step ST73).

If the resultant sum is "3F(H)," the receiving CPU 72 recognizes that the received data is normal (Steps ST74 and ST75). "Received data" as used herein means data whose data length is represented by the count value obtained in Step ST67. If the resultant sum is not "3F(H)," this shows that one cycle of the received PWM signal is different from a regular one cycle due to some cause. Thus, the receiving CPU 72 recognizes that the received data is not normal. Thereafter, the receiving CPU 72 indicates an error (Step ST76). If it is recognized that the received data is normal, the receiving CPU 72 extracts four high order bits from the received data, and defines data including the extracted four bits as finally received data (Step ST77).

As described above, by adding the additional bits to the original data, it is also possible to transmit all-zero data and all-one data, and provide the following effects. That is, even if the PWM signal is transformed due to, for example, noise on the signal, the original data can accurately be recognized in the receiving system as long as the original data is not carried up or is not carried down. For example, it is assumed that two bits are added to a low-order bit position of original four-bit data, and a PWM signal is transmitted according to six-bit data. In this case, if the original data is "1111(B)," the PWM signal is transmitted according to "111101(B)." That is, as shown in FIG. 12, the PWM signal having the high level period corresponding to 61 pulses is transmitted to the transmission line 3. If a PWM signal having a high level period corresponding to 60 pulses reaches the receiving system, the receiving CPU 72 initially recognizes that data "111100(B)" is received. However, since it is possible to finally regard the four high order bits as the original received data, the receiving CPU 72 can recognize that the original data "1111(B)" can be received.

Though a description has been given of the two internal timers in the embodiment, one internal timer may be provided to serve as both the internal timers. Alternatively, as implemented in the third or fourth embodiment, the dummy bits may be added to the data, and the data may be transmitted after division thereof.

In the above embodiments, descriptions have been given of the PWM signal having the high level period corresponding to the value of data to be transmitted. However, it must be noted that the present invention may be applied to a system employing a PWM signal having a low level period corresponding to the value of data to be transmitted.

What is claimed is:

1. A PWM communication system comprising:

signal transmitting circuit which creates a pulse signal having a pulse width according to a value of transmit data by counting pulses in a clock signal, and transmits the created pulse signals to a transmission line on a predetermined cycle;

pulse width measuring circuit coupled to the transmission line to receive, as input, the pulse signal from the transmission line, said pulse width measuring circuit measuring a length of a high level period and a length of a low level period in the pulse signal by using a clock signal having a frequency equivalent to a frequency of the clock signal used in the signal transmitting circuit; and comparing circuit which compares a sum of the length of the high level period and the length of the low level period measured by said pulse width measuring circuit with the predetermined cycle, and outputs an error signal when the sum is not identical with the predetermined cycle.

2. A PWM communication system according to claim 1, wherein the signal transmitting circuit divides said transmit data into a plurality of data, and transmits each data to the transmission line on a cycle set according to the maximum value of each divided data.

3. A PWM communication system according to claim 1, wherein said signal transmitting circuit uses a length corresponding to ($2^n-1$) pulses (n being a positive integer) in the clock signal as the predetermined cycle.

4. A PWM communication system according to claim 3, wherein said signal transmitting circuit divides transmit data into a plurality of data, and transmits each data to a transmission line on a cycle set according to the maximum value of each divided data.

5. A PWM communication system according to claim 3, wherein said comparing circuit coupled to said pulse width measuring circuit includes a comparator coupled to said pulse width measuring circuit to receive as input a length of a high level period and a length of a low level period represented in binary notation, the comparator comparing any one of the length of the high level period and the length of the low level period with a one's complement of the other and outputting an error signal in case of a mismatch.

6. A PWM communication system according to claim 5, wherein said signal transmitting circuit divides transmit data into a plurality of data, and transmits each data to a transmission line on a cycle set according to the maximum value of each divided data.

7. A PWM communication system according to claim 1, wherein the signal transmitting circuit adds dummy bits to a low-order bit position of the least significant bit of original transmit data represented in binary notation, and creates a pulse signal by regarding data including the additional dummy bits as the transmit data, and the PWM communication system further comprising:

a data restoring circuit which converts a significant period of the pulse signal inputted from the transmission line into a binary number, and restores the original transmit a data by removing bits corresponding to the dummy bits from the binary number.

8. A PWM communication system according to claim 7, wherein the signal transmitting circuit divides the transmit data into a plurality of data, and transmits each data to a transmission line on a cycle set according to the maximum value of each divided data.

* * * * *